United States Patent [19]

Yoshisato

[11] 4,188,579
[45] Feb. 12, 1980

[54] SSB TRANSCEIVER

[75] Inventor: Akiyuki Yoshisato, Soma, Japan

[73] Assignee: Alps Electric Co., Ltd., Tokyo, Japan

[21] Appl. No.: 826,408

[22] Filed: Aug. 22, 1977

[30] Foreign Application Priority Data

Aug. 20, 1976 [JP] Japan .................................. 51/99513

[51] Int. Cl.² .............................................. H04B 1/40
[52] U.S. Cl. .......................................... 325/17; 325/50
[58] Field of Search ........................ 325/17, 18, 21, 25, 325/49, 50, 63, 64, 55

[56] References Cited
U.S. PATENT DOCUMENTS

| 3,320,535 | 5/1967 | Broadhead, Jr. | 325/49 |
| 3,413,554 | 11/1968 | Yates | 325/17 |
| 3,641,434 | 2/1972 | Yates | 325/17 |
| 3,983,484 | 9/1976 | Hodama | 325/20 |
| 4,061,974 | 12/1977 | Fletcher | 325/63 |

Primary Examiner—Robert L. Griffin
Assistant Examiner—Michael A. Masinick
Attorney, Agent, or Firm—Guy W. Shoup; Gerard F. Dunne

[57] ABSTRACT

Two pilot signals each transmitted with a predetermined but different frequency are demodulated in the receiving station and sent to a control circuit controlling a saw-tooth wave form voltage generator which is continually varying the frequency of an automatic tuner. The control circuit acts to stop the voltage generator when the demodulated pilot signals have a frequency equal to the predetermined frequency. The received signal can thus be automatically tuned to the transmitted signal.

10 Claims, 6 Drawing Figures

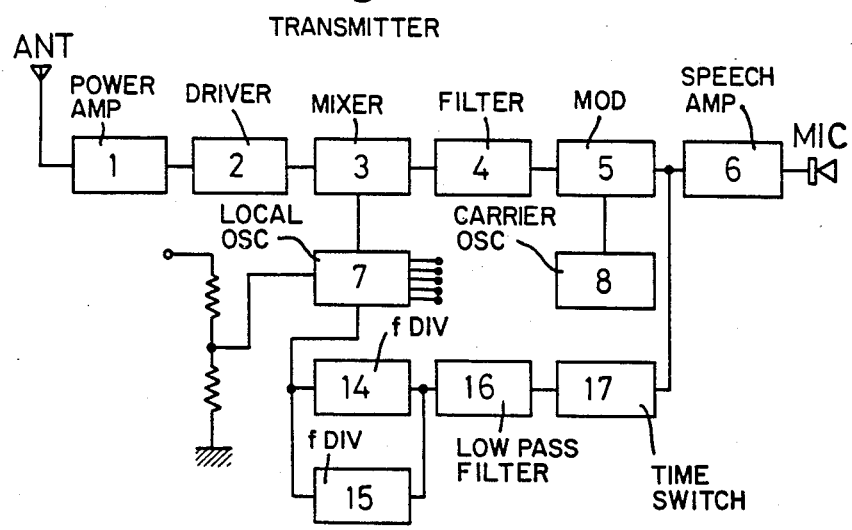
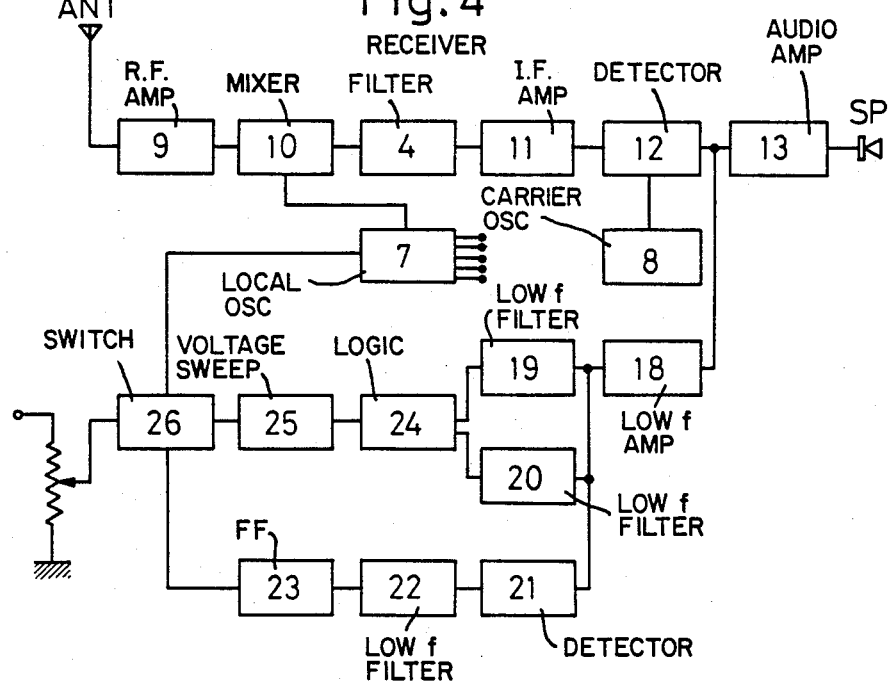

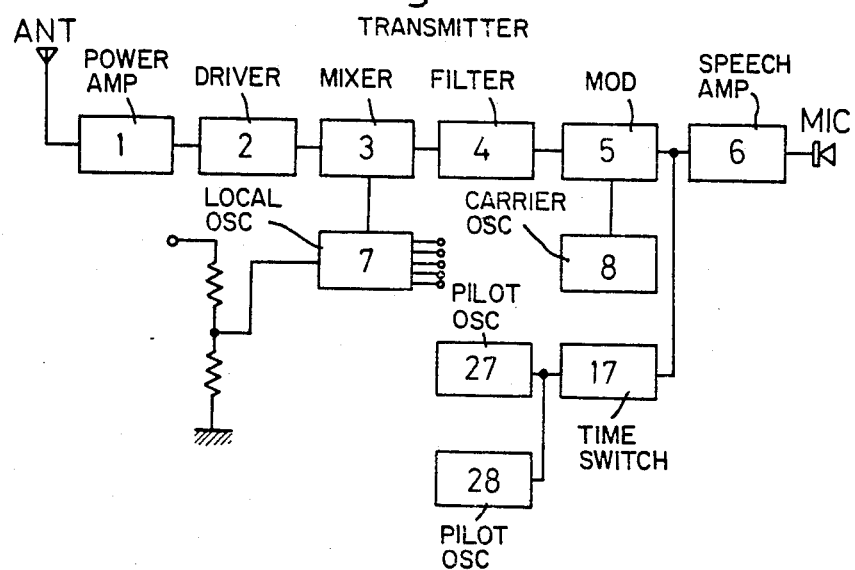
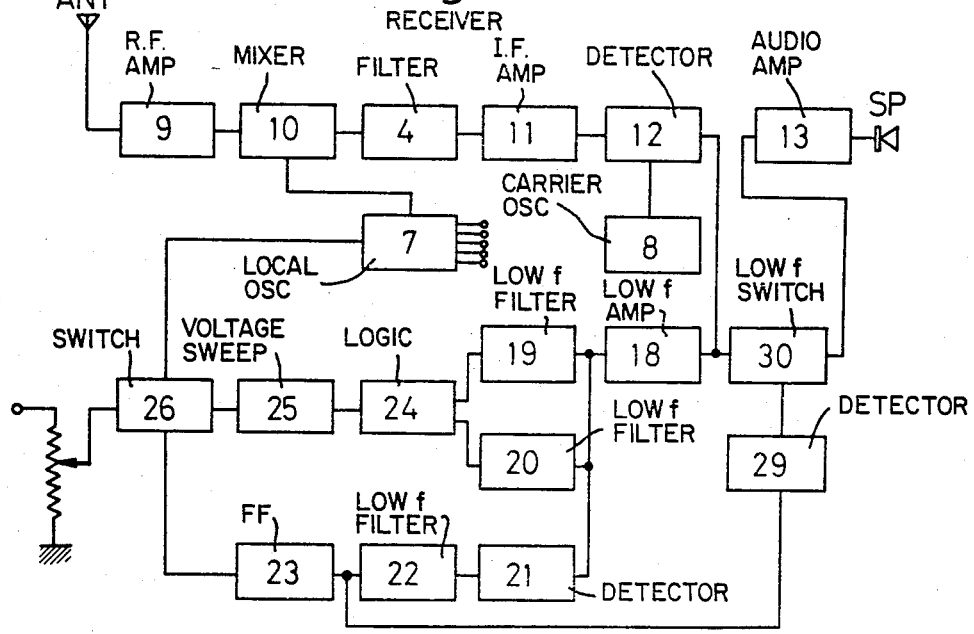

SSB TRANSCEIVER

BACKGROUND OF THE INVENTION

The present invention relates to an SSB (single side band) mode transceiver and, more particularly, to such a transceiver which can be automatically tuned to an incoming signal frequency.

The allowance of frequency deviation among wireless telecommunication stations is a very significant matter. For example, the frequency deviation which is demanded for a Class D station in citizen band is within ±0.0005%. This value is equal to ±1350 Hz on the CB frequency. In typical AM mode operation this allowance is not very important. However, in SSB mode this allowance should be held within a range of 50 to 100 Hz so that the telecommunication can be accomplished with a satisfactory readability. In order to accomplish SSB mode operation by Class D station it is often necessary to tune the transceiver to the same frequency as the other station by means of a manual receiver frequency correction means often referred to as clarifier or fine tuner. It goes without saying that a channel selector must also be used.

A conventional SSB transceiver will be described with reference to FIGS. 1 and 2 which are schematic block diagrams respectively showing transmitter and receiver units of a conventional transceiver. When the transceiver is in the transmission mode, the audio signal from a microphone (MIC) is amplified by means of a speech amplifier 6. The amplified signal is fed to a balanced modulator in which it is converted into a carrier suppressed double side band (DSB) signal by modulating a carrier signal from a carrier oscillator 8. The DSB signal is then converted into a single side band signal after passing a crystal filter 4. The SSB signal is applied to a transmitter mixer in which it is converted into a transmitting signal by being mixed with a signal from a local oscillator 7 comprising a phase locked loop type frequency synthesizer. The transmitting signal is power amplified through a driver 2 and a power amplifier 1 so that it may be transmitted from an antenna (ANT) at a desired power. The aforementioned carrier oscillator 8 is comprised of a quartz crystal oscillator which oscillates at a single frequency. The oscillator is also commonly used for generating a demodulating signal for the receiver unit. The PLL synthesizer 7 is adapted to synthesize desired frequencies by means of one or two crystal elements and the selection of a frequency is accomplished in a digital manner by means of a channel selection switch (not shown). When the transceiver is in a transmission mode, a constant biasing voltage is applied to the PLL synthesizer 7 through constant resistors, since the output frequency from the synthesizer 7 may be changed only when the transceiver is in the receiving mode.

In the receiving mode an incoming signal is amplified by radio frequency amplifier 9 and applied to a mixer 10 in which the amplified incoming signal is converted into an intermediate frequency (IF) by being mixed with a signal from the PLL synthesizer 7. The intermediate frequency signal is passed by a crystal filter 4 so that only a desired frequency band of the signal may be selected. The filtered signal is amplified and fed to a balanced detector 12 in which the signal is demodulated into an audio signal by being mixed with a signal from the carrier oscillator 8. The demodulated signal is amplified to a suitable level to drive a loud speaker by means of an audio amplifier 13. The PLL synthesizer 7 is provided with a variable resistor forming a clarifier or fine tuner for making the receiver frequency equal to the frequency of the other transmitting station when the transceiver is in the receiving mode. If the receiver frequency is different from the transmitting frequency of the other station, the readability of the demodulated signal is low. Normally, the biasing voltage which is applied to a voltage controlled oscillator of the PLL synthesizer 7 is adjusted by manually operating the variable resistor so that the receiver frequency is made equal to the incoming frequency. This operation is well known as zero-beat operation.

The frequency shift due to mechanical and environmental changes is on the order of 1000 Hz in conventional transceivers. Thus in SSB operation a receiver frequency adjusting device is essential. However, this device makes transceiver operation difficult and driving unsafe if a car should be equipped with such a transceiver. Furthermore, owing to this troublesome operation, transceiver operators prefer a typical AM to SSB modes so that interference problems will be minimal.

Thus in order to accomplish high readability SSB telecommunication without manually operating a frequency adjusting device such as a clarifier, the permissible frequency difference between stations may be the order of ±25 to 50 Hz. This value is equal to 1/27–1/54 of frequency deviation in conventional transceivers. This requirement cannot practically be met by a typical CB transceiver since the crystal oscillator is activated in a constant temperature bath.

SUMMARY OF THE INVENTION

Accordingly, it is a primary object of the present invention to provide a SSB transceiver which is not troubled by the above-noted problems.

It is another object of the present invention to provide a SSB transceiver in which the incoming signal frequency can be automatically tuned to the frequency of the transmitted signal.

In accordance with the present invention, pilot signals are superposed on an audio frequency band in the transmission mode. Such pilot signals are demodulated from the received signal and used to automatically tune the transceiver when it is in the receiving mode.

A local oscillator frequency is automatically tuned to the transmitted signal frequency by feeding the demodulated pilot signals to a control circuit controlling the output of a voltage sweeping circuit which controls the local oscillator, whereby the disadvantages of conventional transceivers are eliminated. The present invention aims at an SSB transceiver comprising means for superposing two pilot signals of predetermined frequencies differing by a predetermined amount within an audio frequency band for a short time after the beginning of the transmission mode, means for demodulating said incoming pilot signals in the receiving mode, means operable in the receiving mode for switching manual adjustment of the receiver frequency to automatic adjustment in response to a signal representative of the predetermined difference in frequency between the demodulated pilot signals, and means for sweeping a D.C. voltage applied on an automatic tuning circuit for changing the output frequency of a PLL synthesizer until the frequencies of the demodulated pilot signals are equal to the predetermined frequencies, thereby to maintain the D.C. voltage level when the receiver frequency is tuned to the transmitted signal frequency.

BRIEF DESCRIPTION OF THE DRAWINGS

Details of the invention will be further understood upon reference to the drawings, wherein:

FIGS. 3 and 4 are schematic block diagrams showing transmitter and receiver units of a SSB transceiver according to the present invention, and FIGS. 5 and 6 are schematic block diagrams showing respective transmitter and receiver units of another embodiment of the SSB transceiver according to the present invention.

DESCRIPTION OF THE PREFERRED EMBODIMENTS

Figure 1:
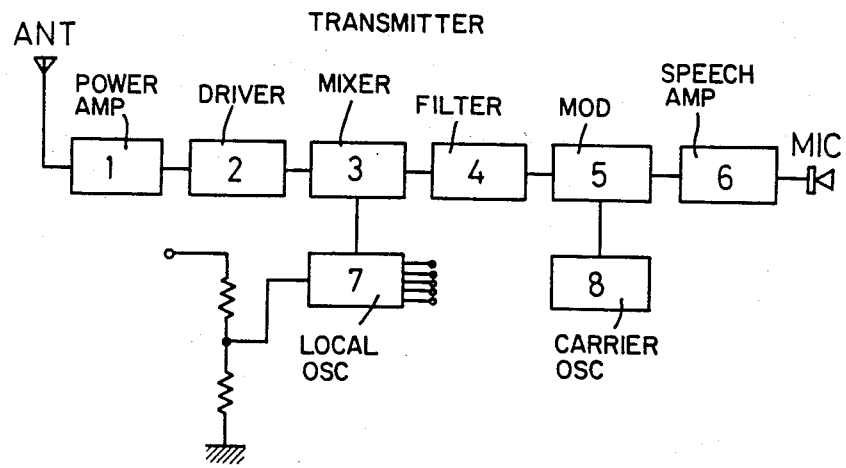
FIGS. 1 and 2 are schematic block diagrams showing respective transmitter and receiver units of a conventional transceiver.
Figure 2:
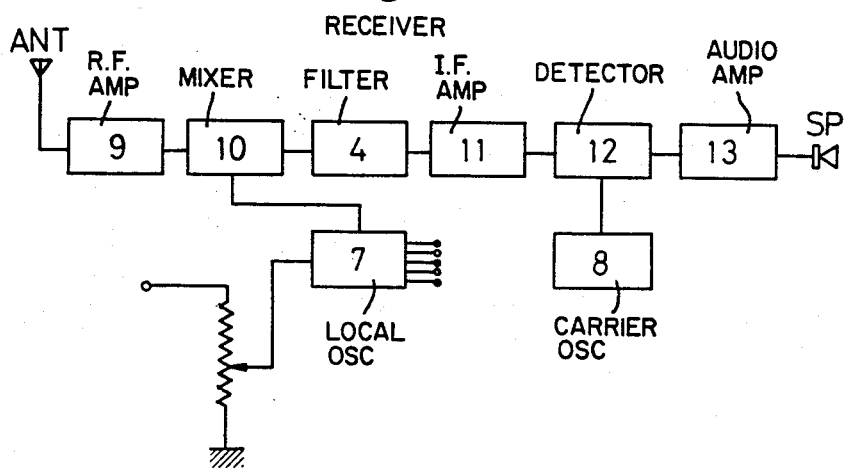

Referring now to FIG. 3, there is shown a transmitter unit which is operated when the transceiver of the present invention is in the transmission mode. The transmitter unit comprises a PLL synthesizer 7 and frequency dividers 14 and 15. A reference signal of 10 KHz which is generated from a reference oscillator of the PLL synthesizer 7 is applied to the frequency dividers 14 and 15 simultaneously. The reference signal is divided by 8 and 10 in the respective frequency dividers 14 and 15 and thus converted into two pilot signals of 1.25 KHz and 1 KHz, each within an audio band of 300 Hz to 3 KHz. The two pilot signals are input to a time switch 17 through a low pass filter 16 in which the harmonic waves are eliminated so that the signals are converted into sinusodial waves. The time switch 17 switches the receiving mode into the transmission mode and possesses a time constant so that it passes the pilot signals for a desired period of time. The filtered signals are superposed on an audio signal amplified by a speech amplifier 6 at the connection between the speech amplifier 6 and a balanced modulator 5 for a predetermined period of time after the beginning of the transmission. In the balanced modulator 5 a carrier signal from a carrier oscillator 8 is modulated with the audio signal on which the pilot signals have been superposed so that a carrier suppressed DSB signal is obtained. The DSB signal is converted into a SSB signal by a crystal filter 4 and the SSB signal is applied to a transmitter mixer 3.

In the transmitter mixer 3 the SSB signal is frequency converted into a desired transmitting frequency by mixing with a signal from the PLL synthesizer 7. The output signal from the balanced mixer 3 is preamplified by a driver amplifier 2 and then power amplified by a power amplifier 1 into a required power so that it is transmitted from an antenna.

Description will now be made with reference to FIG. 4 when the transceiver is in the receiving mode. An incoming signal into the antenna is amplified by a radio frequency amplifier 9 and then input to a mixer 10 in which the amplified incoming signal is frequency converted into an IF (intermediate frequency) by mixing with a signal from the PLL synthesizer 7. The IF signal is passed by the crystal filter 4 so that only a desired frequency band is passed. The filtered signal having the desired frequency band is amplified by an IF amplifier 11 and then input to a balanced detector 12.

In the balanced detector 12 the incoming SSB signal is demodulated into an audio signal including the pilot signals by mixing with a carrier signal from the carrier oscillator 8. The audio signal is amplified by an audio amplifier 13 for the purpose of driving a loud speaker, while the demodulated pilot signals are amplified by a low frequency amplifier 18 and then input to low frequency filters 19 and 20 and a detector 21. The detector 21 possesses a low pass filtering characteristic in which frequencies higher than 300 Hz are cut off. The detector passes a signal having a frequency of 250 Hz which is the difference between the two pilot signals. The filtered 250 Hz signal is applied to a flip-flop 23 through a low frequency filter 22 which possesses an amplification function for a 250 Hz signal and a sharp band pass filter characteristic at a resonant frequency of 250 Hz. The output from flip-flop 23 is inverted and held upon the application of the 250 Hz signal so that a switching circuit 26 functions to switch the manual frequency adjustment mode by the variable resistor into automatic adjustment.

Even if the frequencies of the two pilot signals input to the detector 21 are shifted, the frequency difference between the two pilot signals is constant. For example, if both signals are shifted by 700 Hz, the frequencies of the shifted signals are 1.95 KHz and 1.7 KHz. Accordingly, the switching of the manual frequency adjustment into automatic adjustment may be accomplished irrespective of the frequencies of the demodulated pilot signals since the frequency difference between the two pilot signals is always 250 Hz.

The pilot signals output from the low frequency amplifier 18 is also applied to low frequency filters 19 and 20 which possess sharp band pass filtering characteristics at resonant frequencies of 1.25 KHz and 1 KHz respectively. The low frequency filters 19 and 20 supply signals to a logic circuit 24 only when 1.25 KHz and 1 KHz are input to the filters 19 and 20, the frequencies of which are equal to those of pilot signals which have been transmitted by the other station. The logic circuit 24 comprises and AND circuit and a flip-flop circuit and is adapted to invert its output and hold the inverted state. A voltage sweeping circuit 25 comprises a saw tooth wave form D.C. voltage generator. The output from the voltage sweeping circuit 25 controls the output of the PLL synthesizer 7 through the switching circuit 26. When the receiver signal frequency is correctly tuned to the transmitted signal frequency, the frequencies of the pilot signals are 1.25 Khz and 1 KHz and the output of the logic circuit 24 is inverted so as to stop the change in the output voltage of the voltage sweeping circuit 25 in order to hold the voltage at its level then present.

Incidentally, tuning for incoming signals transmitted by conventional transceivers, which signals ordinarily do not include a pilot signal or signals, may be controlled by manually controlling a variable resister forming a clarifier in a conventional manner.

An alternative embodiment is shown in FIGS. 5 and 6, wherein like reference numerals refer to similiar elements. FIG. 5 shows the block diagram of a transmitter unit which is operated when the transceiver is in the transmitting mode. The differences between the alternative embodiment and the first embodiment will be described. Low frequency oscillators 27 and 28 are provided which stably oscillate at 1.25 KHz and 1 KHz for generating pilot signals. The oscillators 27 and 28 may comprise active elements such as transistors and non-active elements such as L-C tuning circuits. The low frequency filters 19 and 20 having an amplification function may be provided by these oscillators by partially changing the electrical connections thereof to use the tuning circuits as the low frequency filters.

The schematic block diagram of a receiver unit of a third embodiment is shown in FIG. 6. The differences between the third and first embodiments will be described. A low frequency switch 30 is provided between the balance detector 12 and the audio amplifier. The low frequency switch 30 is turned on or off by the output signal from the detector 29 which is supplied with a 250 Hz signal from the low frequency filter 22. The low frequency switch 30 is turned off during the reception of the pilot signals so that the audio signal from the balance modulator 12 may be prevented from leaking from the speaker.

In accordance with the present invention, manual adjustment of the output frequency of a PLL synthesizer is switched into automatic adjustment in response to pilot signals having different frequencies so that a receiver frequency may be tuned to an incoming signal frequency by controlling a voltage sweeping circuit by detecting the frequencies of the pilot signals. Thus the controlability of the transceiver of the present invention is high and the transceiver seldom malfunctions since two pilot signals having a predetermined difference between their frequencies, i.e., of 1.25 KHz and 1 KHz are used. A high performance stable SSB transceiver can be provided without the necessity of crystal oscillators which have a low drift.

While the principles of the present invention have been hereabove described in relation with specific embodiments, it must be clearly understood that the said description has only been made by way of example and does not limit the scope of this invention.

What is claimed is:

1. In an SSB transceiver having a transmission mode and a receiving mode, comprising tuning means operable in said receiving mode for adjusting the frequency of a received signal, said tuning means including an oscillator having a variable output frequency which is manually adjustable, the improvement comprising means for producing two pilot signals having predetermined frequencies differing by a predetermined amount, means operable in said transmission mode for superposing said pilot signals on a transmitted signal, means operable in said receiving mode for demodulating such pilot signals from a received signal, means operable in said receiving mode for switching said tuning means from a manual operating mode to an automatic operating mode in response to a signal having a frequency equal to the predetermined frequency difference between said two pilot signals, means including a voltage sweeping circuit for supplying a varying voltage to said oscillator to correspondingly vary the output frequency thereof, control means receiving said pilot signals demodulated from said received signal and stopping the change in output voltage of said sweeping circuit when said pilot signals are of said predetermined frequencies, whereby said tuning means will automatically adjust the frequency of the received signal to that of the transmitted signal.

2. An SSB transceiver according to claim 1, in which said oscillator comprises a phased-lock frequency synthesizer.

3. An SSB transceiver according to claim 1, comprising a reference oscillator producing a signal which is frequency divided to produce said pilot signals.

4. An SSB transceiver according to claim 1, said pilot signals being produced by respective low frequency oscillators.

5. An SSB transceiver according to claim 1, said pilot signals being produced by respective low frequency oscillators each having a L-C tuning circuit, said control means including two low frequency filters which block said demodulated pilot signals when they are not of said predetermined frequency, said filters being constituted respectively by said L-C tuning circuits.

6. An SSB transceiver according to claim 1, said two pilot signals each having a frequency in an audio band of 300 Hz to 3 kHz.

7. An SSB transceiver according to claim 1, comprising timing means for limiting said pilot signals to only a short time beginning with the start of transmission of said transmitted signal.

8. An SSB transceiver according to claim 7, comprising means blocking the received signal from an audio output during the reception of pilot signals having their frequencies differing by said predetermined amount.

9. An SSB transceiver accoding to claim 8, said two pilot signals each having a frequency in an audio band of 300 Hz to 3 kHz.

10. An SSB transceiver according to claim 7, said two pilot signals each having a frequency in an audio band of 300 Hz to 3 kHz.

* * * * *